US012686611B2

(12) United States Patent
Mansoorzare et al.

(10) Patent No.: US 12,686,611 B2
(45) Date of Patent: Jul. 21, 2026

(54) MICRO-ACOUSTIC RESONATOR SPRINGY ANCHOR BASED ON OFFSET ACOUSTIC REFLECTOR TRENCHES

(71) Applicant: TEXAS INSTRUMENTS INCORPORATED, Dallas, TX (US)

(72) Inventors: Hakhamanesh Mansoorzare, Orlando, FL (US); Ting-Ta Yen, San Jose, CA (US); Yao Yu, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 673 days.

(21) Appl. No.: 17/854,457

(22) Filed: Jun. 30, 2022

(65) Prior Publication Data

US 2024/0002216 A1     Jan. 4, 2024

(51) Int. Cl.
B81B 3/00          (2006.01)
B81B 7/02          (2006.01)

(52) U.S. Cl.
CPC .......... B81B 3/0021 (2013.01); B81B 3/0051 (2013.01); B81B 7/02 (2013.01); *B81B 2201/0271* (2013.01); *B81B 2203/0109* (2013.01); *B81B 2203/0163* (2013.01); *B81B 2203/0307* (2013.01); *B81B 2203/0315* (2013.01); *B81B 2203/033* (2013.01)

(58) Field of Classification Search
CPC ....... B81B 7/0054; B81B 7/02; B81B 3/0051; B81B 3/0021; B81B 2201/0271; B81B 2203/0163; B81B 2203/0315; B81B 2203/0109; B81B 2203/033; B81B 2203/0307; H03H 9/0595; H03H 9/02338; H03H 9/2405; H03H 9/02433; H03H 9/1057; H03H 9/2452; H03H 9/132; H03H 9/02393; H03H 9/17; H03H 9/02228; H03H 9/171; H03H 9/02448; H03H 9/02275; H03H 9/13; H03H 9/02062; H03H 9/02015; H03H 9/172; H03H 2009/0244; H03H 2009/02385; H03H 2009/155; H03H 2009/02503; H03H 9/02102; H03H 9/02031
See application file for complete search history.

(56) References Cited

U.S. PATENT DOCUMENTS

| | | | | |
|---|---|---|---|---|
| 4,350,918 A | * | 9/1982 | Sato ..................... | H03H 9/0211 |
| | | | | 310/361 |
| 7,800,282 B2 | * | 9/2010 | Ayazi .................... | H03H 9/172 |
| | | | | 310/317 |
| 7,990,232 B1 | * | 8/2011 | Lee ...................... | H03H 9/2436 |
| | | | | 333/186 |

(Continued)

*Primary Examiner* — Mouloucoulaye Inoussa
(74) *Attorney, Agent, or Firm* — Zhenhai Fu; Frank D. Cimino

(57)          ABSTRACT

A circuit includes: integrated circuit (IC) layers; a cavity formed in at least one of the IC layers; and a micro-acoustic resonator suspended in the cavity by an anchor. The anchor includes: a bridge portion coupled to the micro-acoustic resonator and extending over the cavity; a first acoustic reflector portion adjacent the bridge portion, extending over the cavity, and oriented differently than the bridge portion; and a second acoustic reflector portion adjacent the first acoustic reflector portion, extending over the cavity, and oriented differently than the first acoustic reflector portion.

23 Claims, 7 Drawing Sheets

(56) References Cited

U.S. PATENT DOCUMENTS

| | | | | |
|---|---|---|---|---|
| 8,513,863 B2 * | 8/2013 | Stephanou | H03H 9/585 | 310/365 |
| 8,664,836 B1 * | 3/2014 | Kuypers | H03H 9/02448 | 310/365 |
| 8,947,747 B2 * | 2/2015 | Ikeda | H04N 1/02895 | 359/477 |
| 9,634,227 B1 * | 4/2017 | Thalmayr | H03H 9/02338 | |
| 9,954,513 B1 * | 4/2018 | Thalmayr | H03H 9/02338 | |
| 10,009,002 B1 * | 6/2018 | Branch | H03H 3/007 | |
| 10,778,182 B2 * | 9/2020 | Nakamura | H03H 9/17 | |
| 2008/0246559 A1 * | 10/2008 | Ayazi | H03H 9/172 | 333/187 |
| 2009/0180167 A1 * | 7/2009 | Tani | B81B 3/0051 | 359/198.1 |
| 2010/0066467 A1 * | 3/2010 | Ayazi | H03H 9/172 | 333/187 |
| 2010/0156566 A1 * | 6/2010 | Abdolvand | H03H 9/2405 | 333/195 |
| 2010/0181868 A1 * | 7/2010 | Gaidarzhy | H03H 9/02228 | 310/313 B |
| 2010/0182102 A1 * | 7/2010 | Kuypers | H03H 9/02834 | 333/197 |
| 2010/0315179 A1 * | 12/2010 | Schoepf | H03H 9/2405 | 333/186 |
| 2011/0210801 A1 * | 9/2011 | Rottenberg | H03H 9/2463 | 331/156 |
| 2012/0274184 A1 * | 11/2012 | Stephanou | H03H 9/0207 | 29/25.35 |
| 2012/0280594 A1 * | 11/2012 | Chen | H10N 30/88 | 310/313 R |
| 2013/0021305 A1 * | 1/2013 | Zuo | H03H 3/02 | 29/25.35 |
| 2013/0096825 A1 * | 4/2013 | Mohanty | G01C 21/1654 | 701/472 |
| 2013/0130502 A1 * | 5/2013 | Sparks | B81C 1/00158 | 438/702 |
| 2013/0135264 A1 * | 5/2013 | Black | H03H 9/178 | 216/13 |
| 2013/0313847 A1 * | 11/2013 | Tortatice | B25J 11/00 | 294/209 |
| 2014/0062262 A1 * | 3/2014 | Schoepf | H03H 9/1057 | 310/343 |
| 2014/0125431 A1 * | 5/2014 | Bhattacharjee | H03H 9/2405 | 361/278 |
| 2015/0318838 A1 * | 11/2015 | Bhattacharjee | H03H 9/02228 | 310/321 |
| 2016/0099701 A1 * | 4/2016 | Rinaldi | H03H 9/174 | 422/90 |
| 2016/0182008 A1 * | 6/2016 | Bhattacharjee | H03H 9/02275 | 29/25.35 |
| 2016/0182009 A1 * | 6/2016 | Bhattacharjee | H03H 9/02574 | 310/313 R |
| 2016/0191017 A1 * | 6/2016 | Edrees | H10N 39/00 | 333/191 |
| 2016/0322954 A1 * | 11/2016 | Kaida | H03H 9/2447 | |
| 2017/0069822 A1 * | 3/2017 | Nishimura | H03H 9/02338 | |
| 2017/0149408 A1 * | 5/2017 | Belsick | G01N 29/32 | |
| 2017/0297895 A1 * | 10/2017 | Kautzsch | B81B 3/0021 | |
| 2018/0019724 A1 * | 1/2018 | Doll | H10N 30/878 | |
| 2018/0054180 A1 * | 2/2018 | Nakamura | H03H 9/0595 | |
| 2018/0191329 A1 * | 7/2018 | Nishimura | H03H 9/02433 | |
| 2018/0191330 A1 * | 7/2018 | Nishimura | H03H 9/0595 | |
| 2019/0181830 A1 * | 6/2019 | Xu | H03H 9/175 | |
| 2019/0296712 A1 * | 9/2019 | Unami | H03H 9/171 | |
| 2019/0305749 A1 * | 10/2019 | Perahia | H03H 9/02228 | |
| 2022/0029602 A1 * | 1/2022 | Lan | H03H 9/02228 | |
| 2022/0263489 A1 * | 8/2022 | Xu | H03H 9/02062 | |
| 2022/0278671 A1 * | 9/2022 | Takeyama | H03H 9/1057 | |

* cited by examiner

MICRO-ACOUSTIC RESONATOR SPRINGY ANCHOR BASED ON OFFSET ACOUSTIC REFLECTOR TRENCHES

BACKGROUND

Many electronic devices rely on a timing signal (e.g., a clock signal) for operations. The timing signal is generated based on a resonating component and related oscillator circuitry. Multipliers or dividers may be used to increase or decrease the frequency of the timing signal. For example, quartz crystal tuned oscillators (XOs) have good relative frequency accuracy, low frequency drift (or shift) as a function of temperature, and low noise. However, while the density of electronics has grown exponentially following Moore's law, the area and volume occupied by quartz crystals has not scaled accordingly. To address the scaling issue of XOs, efforts have been directed toward replacing XOs with oscillators based on micro-acoustic resonators. Micro-acoustic resonators are a type of micro-electrome-chanical system (MEMS). There are different options to trigger acoustic resonation in a MEMS. One type of micro-acoustic resonator involves a suspended or anchored piezo-electric circuit and a control circuit. When the control circuit applies one or more control signals to the terminals of the suspended or anchored piezoelectric circuit, acoustic reso-nation in one or more directions results. The acoustic resonation from the suspended piezoelectric circuit is used by the oscillator circuitry to generate a timing signal.

Micro-acoustic resonators suffer from package-induced stress and anchor loss. Such losses increase as the resonation frequency decreases. Several piezoelectric circuit and anchor designs have been developed, where the anchor design occupies a significant amount of space on a semi-conductor die. FIG. 1 is a perspective view of an integrated circuit (IC) 100 illustrating a micro-acoustic resonator 102 and anchor design in accordance with a conventional approach. In FIG. 1, the micro-acoustic resonator 102 is surrounded by trenches 108 and 110, except where two anchors 104 and 106 couple the micro-acoustic resonator 102 to a first ambient portion 112 of the IC 100. The first ambient portion 112 of the IC 100 is isolated from a second ambient portion 118 by an ambient trench 114 that surrounds the first ambient portion 112 except via one coupling zone 116. While the ambient trench 114 enables adequate isola-tion of the micro-acoustic resonator 102 relative to the second ambient portion 118 of the IC 100, the ambient trench 114 occupies a significant amount of space on the IC 100.

SUMMARY

In an example embodiment, a circuit comprises: inte-grated circuit (IC) layers; a cavity formed in at least one of the IC layers; and a micro-acoustic resonator suspended in the cavity by an anchor. The anchor includes: a bridge portion coupled to the micro-acoustic resonator and extend-ing over the cavity; a first acoustic reflector portion coupled to the bridge portion, extending over the cavity, and oriented differently than the bridge portion; and a second acoustic reflector portion coupled to the first acoustic reflector por-tion, extending over the cavity, and oriented differently than the first acoustic reflector portion.

In another example embodiment, an IC layer comprises: a micro-acoustic resonator portion; an ambient portion sepa-rated from micro-acoustic resonator portion by a trench; and an anchor between the micro-acoustic resonator portion and the ambient portion. The anchor includes: a bridge portion that extends across the trench; a first acoustic reflector portion coupled to the bridge portion and oriented differently than the bridge portion; and a second acoustic reflector portion coupled to the first acoustic reflector portion and oriented differently than the first acoustic reflector portion.

In yet another example embodiment, a method of manu-facturing an IC having a micro-acoustic resonator is described. The method comprises: providing an IC layer having a micro-acoustic resonator portion and an ambient portion; adding a trench in the IC layer to separate the micro-acoustic resonator portion from the ambient portion; and forming an anchor in the IC layer between the micro-acoustic resonator portion and the ambient portion. Forming the anchor includes: forming a bridge portion of the anchor in the IC layer, the bridge portion extending across the trench; forming a first acoustic reflector portion of the anchor in the IC layer, the first acoustic reflector portion coupled to the bridge portion and oriented differently than the bridge portion; and forming a second acoustic reflector portion of the anchor in the IC layer, the second acoustic reflector portion coupled to the first acoustic reflector por-tion and oriented differently than the first acoustic reflector portion.

DETAILED DESCRIPTION

Figure 1:
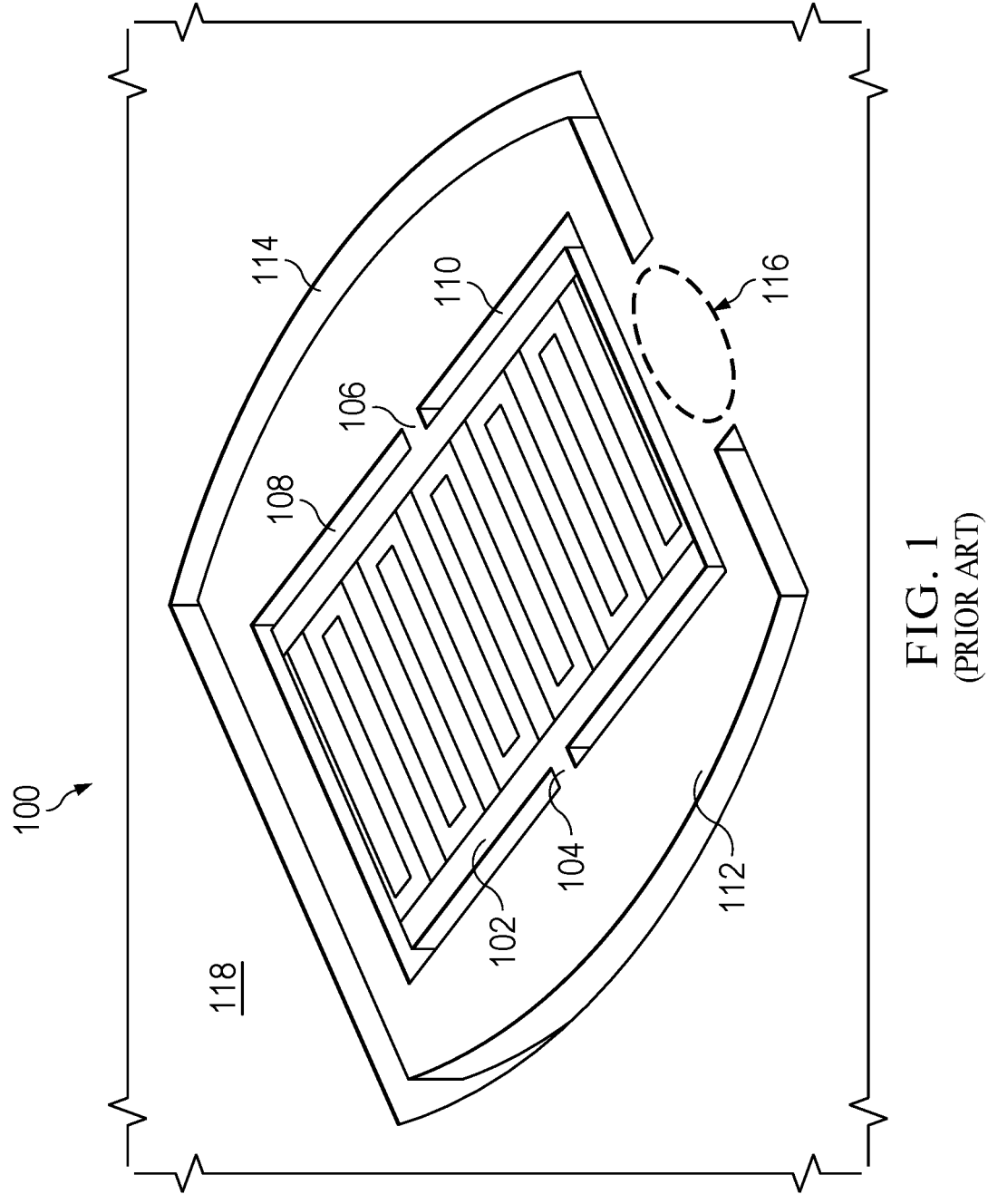
FIG. 1 is a perspective view of an integrated circuit (IC) illustrating a micro-acoustic resonator and anchor design in accordance with a conventional approach.

The same reference number is used in the drawings for the same or similar (either by function and/or structure) features. Described herein is an anchor design for a micro-acoustic resonator. The anchor design includes offset acoustic reflec-tor trenches that form a springy anchor having offset acous-tic reflection surfaces configured to reflect acoustic energy back towards the micro-acoustic resonator. The offset acous-tic reflection surfaces may be concave surfaces, corner surfaces, L shape surfaces, or other surfaces facing the micro-acoustic resonator and configured to reflect acoustic energy back towards the micro-acoustic resonator. This anchor design enhances isolation (e.g., thermal stress isola-tion and/or acoustic isolation) of the micro-acoustic resona-tor from an ambient portion of an integrated circuit (IC) and vice versa. By varying the anchor as desired (e.g., selecting the number of offset acoustic reflection surfaces, selecting the amount of overlap, or selecting the thickness of the anchor stem and/or branches), a target amount of isolation for a micro-acoustic resonator may be achieved using less overall space compared to the IC 100 of FIG. 1. For example, an anchor design having offset acoustic reflector trenches may be used to avoid an ambient trench such as the ambient trench 114 of FIG. 1. In some example embodiments, the dimensions of the anchor design (e.g., trench size, reflective surface angles, and height/width/length of the related anchor branches) may be tuned to improve the isolation function. Such tuning may be based, for example, on a target wavelength related to a resonant frequency of the micro-acoustic resonator.

In some example embodiments, the anchor design is an in-plane thickness Lame mode springy anchor. The anchor design is formed based on offset acoustic reflector trenches that isolate the micro-acoustic resonator from package stress and confine its energy leakage. With the offset acoustic reflector trenches, the anchor design includes an extended length/meandering path and routing to isolate package stress from rest of the IC. The length/distance between the anchor bridge (also referred to a tether or anchor stem herein) and one or more of the offset acoustic reflector trenches is designed to sustain a standing wave, serving as acoustic reflectors to confine acoustic energy. In some example embodiments, the anchor design is defined by trenching the thin film of the resonator structure (silicon, oxide, electrode, etc.) as needed. As desired, the anchor design may include additional turns (increasing the length/meandering path) for further isolation.

Figure 2:
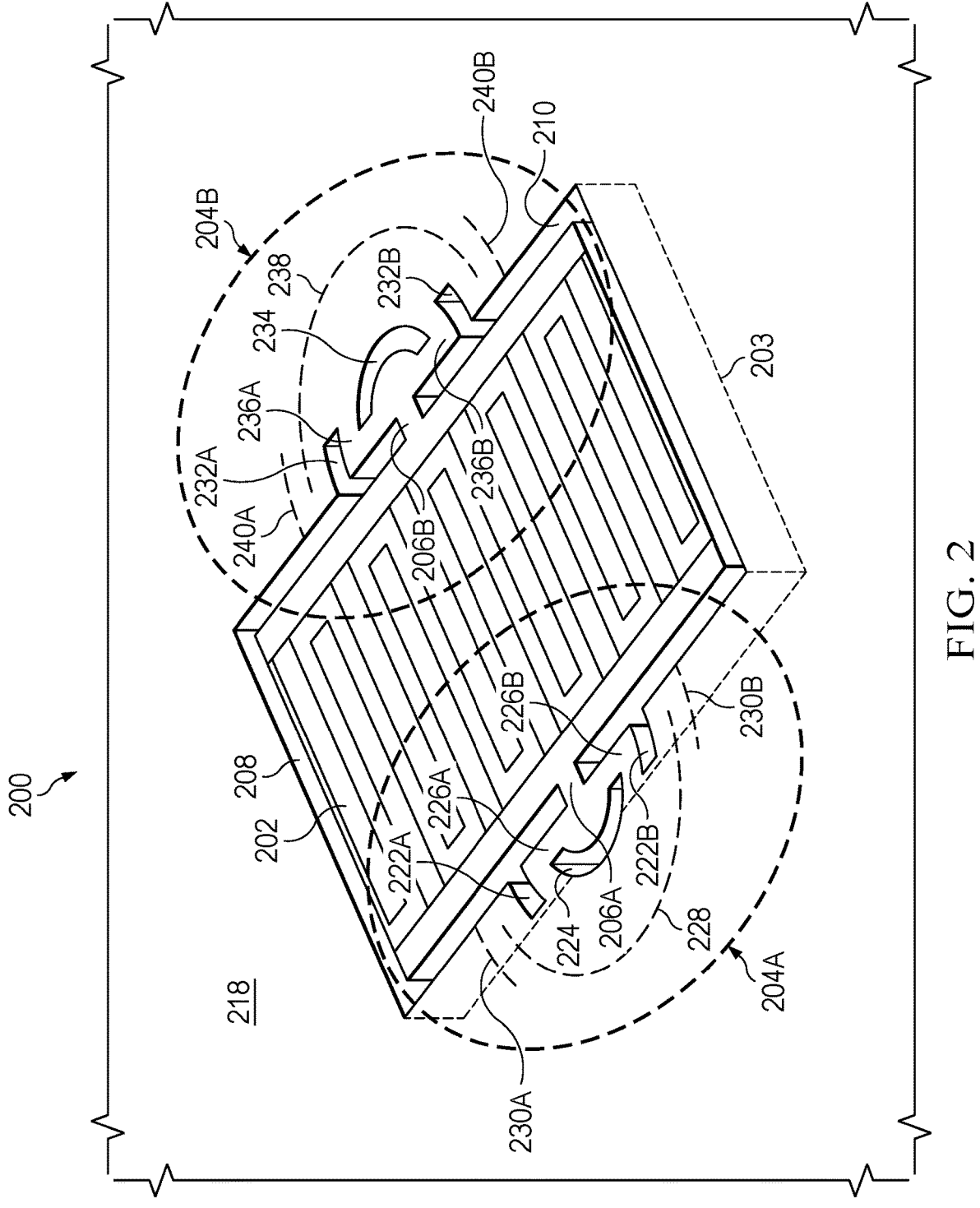
FIG. 2 is a perspective view of an IC illustrating a micro-acoustic resonator and anchor design in accordance with an example embodiment.

FIG. 2 is a perspective view of an IC 200 illustrating a micro-acoustic resonator 202 and anchor design in accordance with an example embodiment. In FIG. 2, the micro-acoustic resonator 202 is suspended over a cavity 203, where part of the cavity 203 is visible as trenches 208 and 210 around the micro-acoustic resonator 202. The anchor design of FIG. 2 includes two anchor zones 204A and 204B formed on opposite sides of the micro-acoustic resonator 202. Each of the two anchors zones 204A and 204B includes offset acoustic reflector trenches. With the anchor design of FIG. 2, the micro-acoustic resonator 202 is isolated from an ambient portion 218 of the IC 200 of FIG. 2. In some example embodiments, only one anchor zone (e.g., the anchor zone 204A or the anchor zone 204B) is used with a given micro-acoustic resonator. As another option, more than two anchor zones (e.g., four anchor zones) could be used with a given micro-acoustic resonator.

As shown, the anchor zone 204A includes a central acoustic reflector trench 224 and side acoustic reflector trenches 222A and 222B on opposite sides of the central acoustic reflector trench 224. In some example embodiments, the anchor zone 204A may include additional acoustic reflector trenches. For example, an outer central acoustic reflector trench could be added along curved line 228. When an outer central acoustic reflector trench is used, the anchor zone 204A may include outer side acoustic reflector trenches along the curved lines 230A and 230B.

As shown in FIG. 2, there may be some overlap in the relative positions of the offset acoustic reflector trenches of the anchor zone 204A (e.g., the radial position overlap of the trenches relative to the micro-acoustic resonator 202) to increase the anchor path length and/or increase the reflection of acoustic energy back towards the micro-acoustic resonator 202. In different embodiments, the amount of overlap in the relative positions of the offset acoustic reflector trenches of the anchor zone 204A may vary. In different example embodiments, the dimensions of the offset acoustic reflector trenches and the resulting anchor layout may also vary. In some example embodiments, a target wavelength related to a resonant frequency of the micro-acoustic resonator 202 is used to select the dimensions of the offset acoustic reflector trenches and the resulting anchor layout for the anchor zone 204A. As another option, an anchor springiness target, a thermal stress isolation target and/or an acoustic isolation target may be considered when selecting the dimensions of the acoustic reflector trenches and the resulting anchor layout for the anchor zone 204A. In the example of FIG. 2, the anchor layout for the anchor zone 204A includes symmetrical anchor branches 226A and 226B extending from a bridge or stem 206A. In other example embodiments, the anchor layout of the anchor zone 204A could include only one anchor branch extending from the bridge 206A or non-symmetrical anchor branches extending from the bridge 206A.

As shown, the anchor zone 204B includes a central acoustic reflector trench 234 and side acoustic reflector trenches 232A and 232B on opposite sides of the central acoustic reflector trench 234. In some example embodiments, the anchor zone 204B may include additional offset acoustic reflector trenches. For example, an outer central acoustic reflector trench could be added along curved line 238. When an outer central acoustic reflector trench is used, the anchor zone 204B may include outer side acoustic reflector trenches along the curved lines 240A and 240B.

As shown in FIG. 2, there may be some overlap in the relative positions of the offset acoustic reflector trenches of the anchor zone 204B (e.g., the radial position overlap of the trenches relative to the micro-acoustic resonator 202) to increase the overall anchor path length and/or increase the reflection of acoustic energy back towards the micro-acoustic resonator 202. In different embodiments, the amount of overlap in the relative positions of the offset acoustic reflector trenches of the anchor zone 204B may vary. In different example embodiments, the dimensions of the offset acoustic reflector trenches and the resulting anchor layout may also vary. In some example embodiments, a target wavelength related to a resonant frequency of the micro-acoustic resonator 202 is used to select the dimensions of the offset acoustic reflector trenches and the resulting anchor layout for the anchor zone 204B. As another option, an anchor springiness target, a thermal stress isolation target and/or an acoustic isolation target may be considered when selecting the dimensions of the acoustic reflector trenches and the resulting anchor layout for the anchor zone 204B. In the example of FIG. 2, the anchor layout for the anchor zone 204B includes symmetrical anchor branches 236A and 236B extending from a bridge or stem 206B. In other example embodiments, the anchor layout of the anchor zone 204B could include only one anchor branch extending from the bridge 206B or unsymmetrical anchor branches extending from the bridge 206B.

Figure 3:
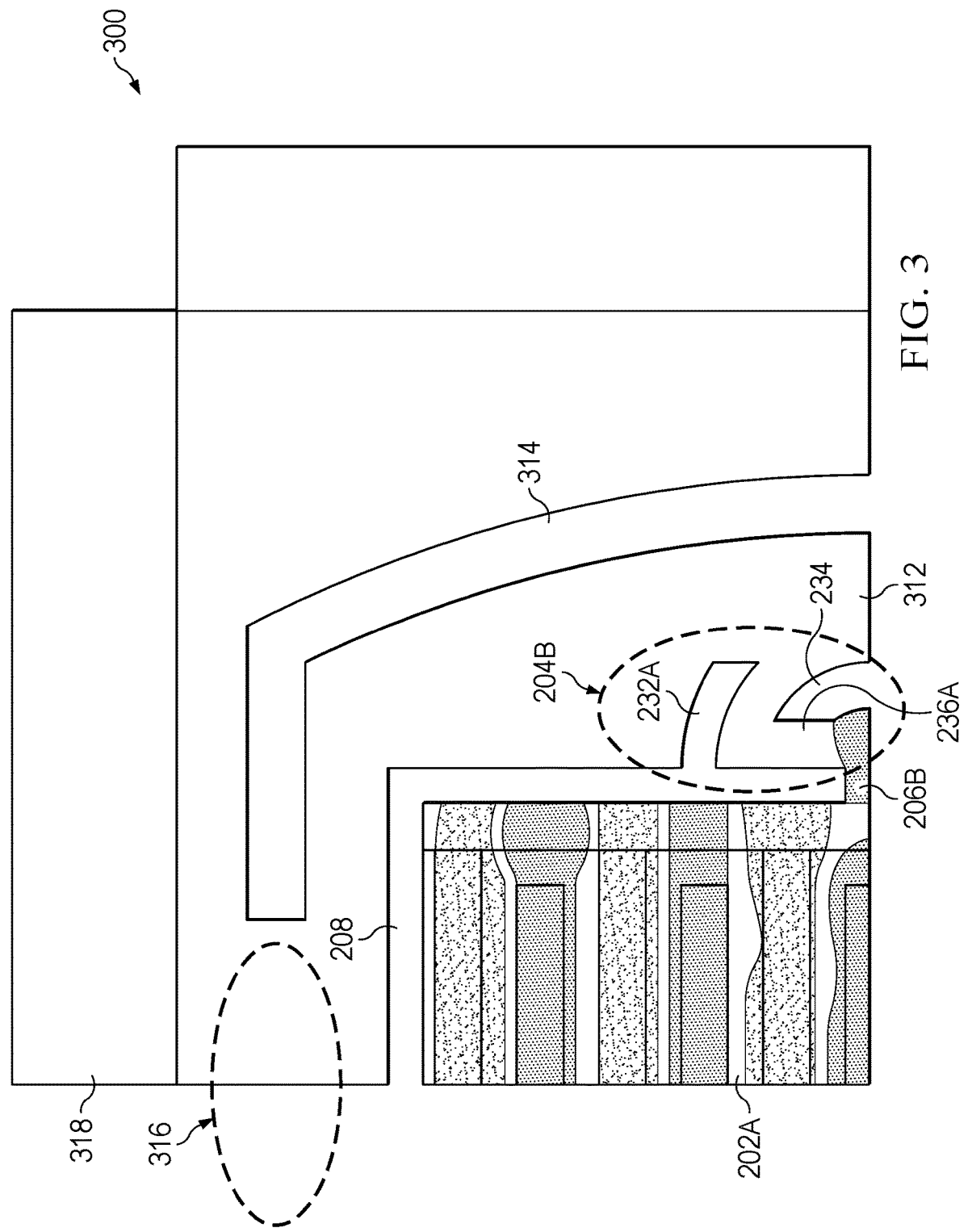
FIG. 3 is a top view of an IC illustrating part of a micro-acoustic resonator and anchor design in accordance with an example embodiment.

FIG. 3 is a top view of an IC 300 illustrating part of a micro-acoustic resonator 202A (an example of the micro-acoustic resonator 202 of FIG. 2) and an anchor design in accordance with an example embodiment. In the example of FIG. 3, the anchor design corresponds to part of the anchor zone 204B of FIG. 2. Specifically, part of the bridge 206B, the anchor branch 236A, part of the central acoustic reflector trench 234, and the side acoustic reflector trench 232A of the anchor zone 204B are shown in FIG. 3. In the example of FIG. 3, the anchor zone 204B is in a first ambient portion 312 of the IC 300. The first ambient portion 312 is between the trench 208 and an ambient trench 314 of the IC 300. The ambient trench 312 surrounds the first ambient portion 312 except at one coupling zone 316 and isolates a second ambient portion 318 of the IC 300 from the first ambient portion 312 except via the coupling zone 316. Without limitation, example dimensions for the portion of the IC 300 represented in FIG. 3 are 200 um×200 um. In some example embodiments, as in FIG. 3, an ambient trench (e.g., the ambient trench 314) is combined with an anchor design (e.g., the anchor zone 204B and/or the anchor zone 204A of FIG. 2) having offset acoustic reflector trenches that form a springy anchor having offset acoustic reflection surfaces configured to reflect acoustic energy back towards the micro-acoustic resonator.

Figure 4:
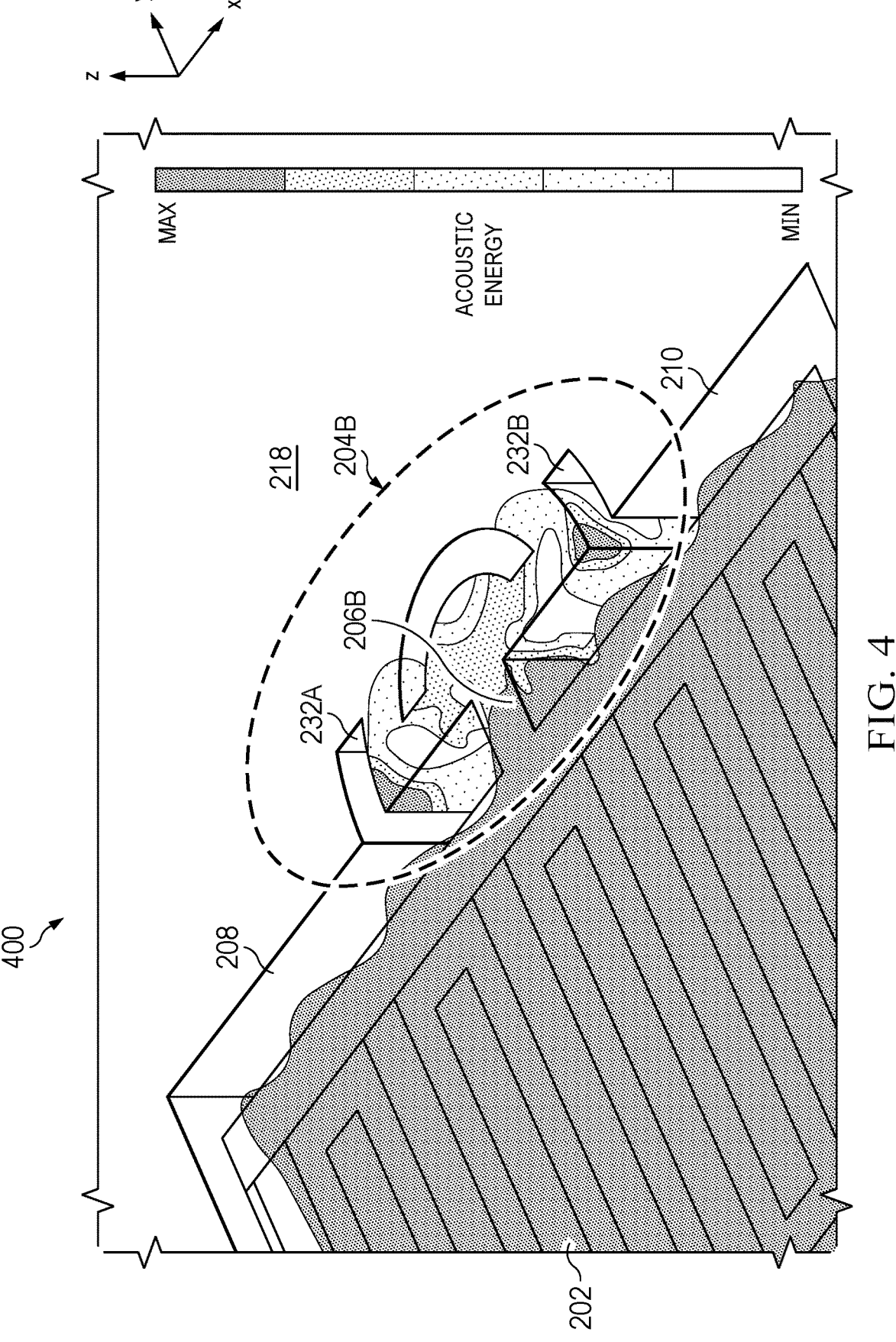
FIG. 4 is a perspective view of an IC illustrating acoustic energy during operations of a micro-acoustic resonator in accordance with an example embodiment.

FIG. 4 is a perspective view of an IC 400 illustrating acoustic energy during operations of the micro-acoustic resonator 202 in accordance with an example embodiment. As shown, the acoustic energy of the IC 400 is concentrated in the micro-acoustic resonator 202. As the acoustic energy of the micro-acoustic resonator 202 propagates to the anchor zone 204B, the acoustic energy is reflected and dispersed such that the acoustic energy of the micro-acoustic resonator 202 is isolated from the ambient portion 218 of the IC 400.

In some example embodiments, the dimensions for portions of the anchor zone 204B are a function of a target wavelength related to the resonant frequency of the micro-acoustic resonator 202. For example, the trenches 208, 210, and bridge 206B may have a length (in the y direction) that is approximately ½ of a target wavelength related to the resonant frequency of the micro-acoustic resonator 202. Also, the length of the anchor branches (from the center of the bridge 206B to each of the respective side acoustic reflector trenches 232A and 232B) is approximately the same as the target wavelength related to the resonant frequency of the micro-acoustic resonator 202.

Figure 5:
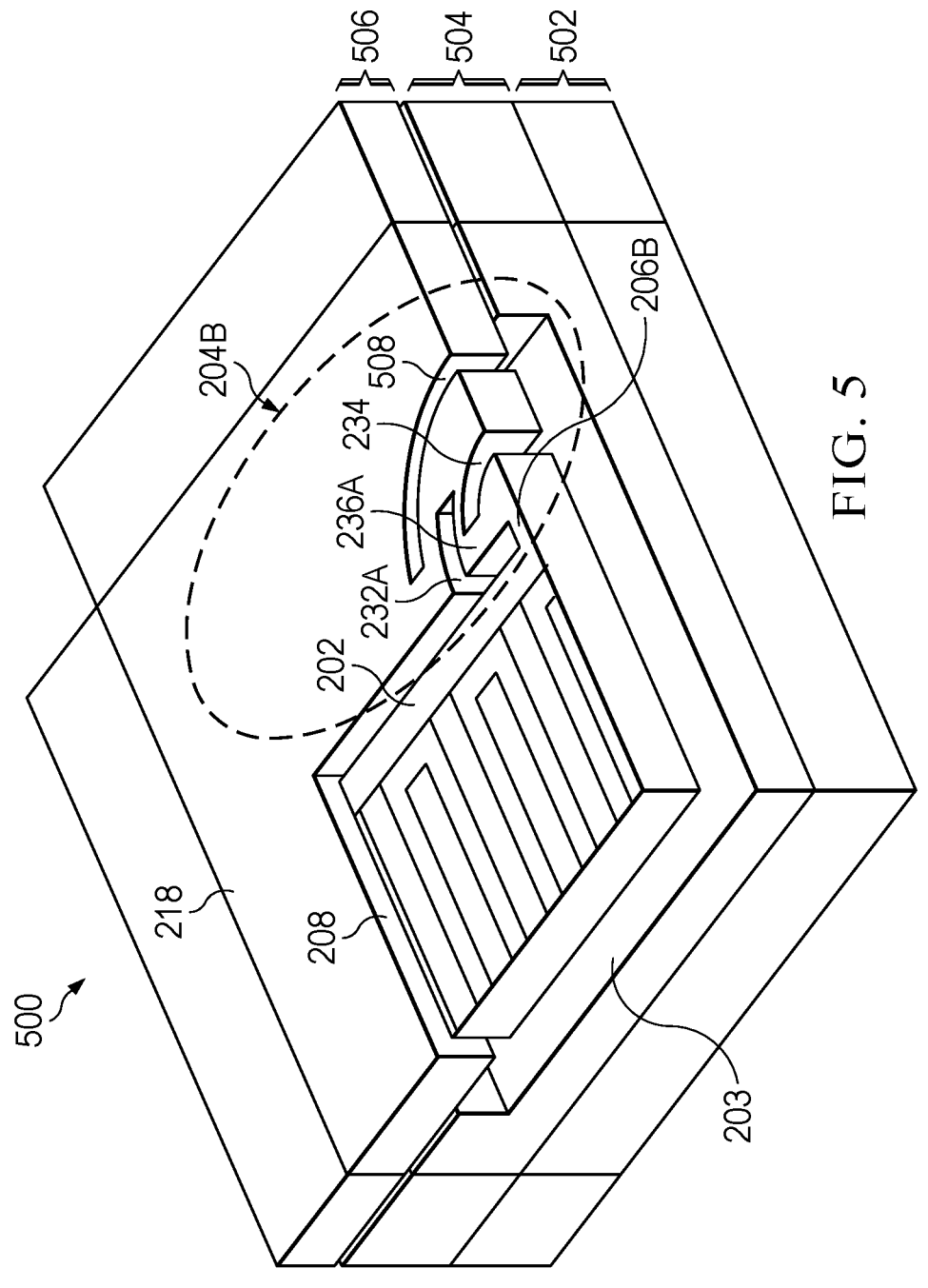
FIG. 5 is a cross-sectional view of an IC illustrating part of a micro-acoustic resonator and anchor design in accor-dance with another example embodiment.

FIG. 5 is a cross-sectional view of an IC 500 (e.g., an example of the IC 200 in FIG. 2) illustrating part of the micro-acoustic resonator 202 and anchor design in accordance with another example embodiment. In the example of FIG. 5, the anchor design corresponds to part of the anchor zone 204B of FIG. 2. Specifically, FIG. 5 shows part of the bridge 206B, the anchor branch 236A, part of the central acoustic reflector trench 234, and the side acoustic reflector trench 232A of the anchor zone 204B. In some example embodiments, the anchor zone 204B includes an outer central acoustic reflector trench 508 as shown in FIG. 5.

With the cross-sectional view of FIG. 5, the cavity 203 over which the micro-acoustic resonator 202 is suspended is visible. As shown, the cavity 203 extends beyond the outer central acoustic reflector trench 508. In some example embodiments, the micro-acoustic resonator 202, the anchor zone 204B, and the ambient portion 218 of the IC 500 are part of a shared layer (the third layer 506) of the IC 500. As shown, the shared layer includes an overhang portion over the cavity 203, where the micro-acoustic resonator 202 and the anchor are formed in the overhang portion.

Besides the third layer 506, the IC 500 of FIG. 5 includes a first layer 502 and a second layer 504, where the cavity 203 is formed in the second layer 504 of the IC 500. In some example embodiments, the first layer 502 and the second layer 504 are the same layer (e.g., a handle layer made from silicon). Meanwhile, the third layer 506 may include device sub-layers. Without limitation, the third layer 506 may include sub-layers of metal, piezoelectric material, and silicon (e.g., Mo/Ain/Mo/Si) to build the micro-acoustic resonator 202 and, possibly, other devices or circuitry. As needed, the anchor zone 206B is formed by adding offset acoustic reflector trenches to the third layer 506 (or related sub-layers) of the IC 500. In different example embodiments, the number of layers of the IC 500, the position of the micro-acoustic resonator 202 in the IC 500, the position of the cavity 203, and/or the dimensions or features of an anchor design (e.g., the anchor zone 204B in FIG. 5) may vary. Regardless of these different options, the anchor design may include offset acoustic reflector trenches that form a springy anchor having offset acoustic reflection surfaces configured to reflect acoustic energy back towards the micro-acoustic resonator 202. In this manner, the micro-acoustic resonator 202 is isolated from the ambient portion 218 of the IC 500.

In some example embodiments, a circuit includes: IC layers (e.g., the first layer 502, the second layer 504, and the third layer 506 in FIG. 5); a cavity (e.g., the cavity 203 in FIGS. 2 and 5) formed in at least one of the IC layers (e.g., the second layer 504); and a micro-acoustic resonator (e.g., the micro-acoustic resonator 202 in FIG. 2, 4, or 5) suspended in the cavity by an anchor. The anchor includes: a bridge portion (e.g., the bridge 206B in FIGS. 2 and 5) coupled to the micro-acoustic resonator and extending over the cavity; a first acoustic reflector portion (e.g., a first part of the anchor branch 236A in FIGS. 2 and 5) coupled to the bridge portion, extending over the cavity, and oriented differently than the bridge portion; and a second acoustic reflector portion (e.g., a second part of the anchor branch 236A in FIGS. 2 and 5 that is oriented differently than the first part of the anchor branch 236A) coupled to the first acoustic reflector portion, extending over the cavity, and oriented differently than the first acoustic reflector portion.

In some example embodiments, the micro-acoustic resonator and the IC layers include a shared layer (e.g., the third layer 506 in FIG. 5), the shared layer including an overhang portion over the cavity, and the micro-acoustic resonator and the anchor being formed in the overhang portion. In some example embodiments, the overhang portion includes a first trench (e.g., the central acoustic reflector trench 234 in FIGS. 2 and 5) that forms a reflective boundary of the first acoustic reflector portion. In some example embodiments, the reflective boundary is a first reflective boundary, and the overhang portion includes a second trench (e.g., the side acoustic reflector trench 232A in FIGS. 2 and 5) that forms a second reflective boundary of the second acoustic reflector portion, the first reflective boundary being oriented differently than the second reflective boundary. In some example embodiments, the first trench and the second trench are concave trenches relative to the micro-acoustic resonator (i.e., the concave trenches reflect acoustic energy back towards the micro-acoustic resonator). In other example embodiments, each of the first trench and the second trench may form a corner, an L shape, or other shape configured to reflect acoustic energy back toward the micro-acoustic resonator.

In some example embodiments, the anchor includes a third acoustic reflector portion (e.g., another part of the anchor branch 236A when the outer central acoustic reflector trench 508 in FIG. 5 is used) coupled to the second acoustic reflector portion, extending over the cavity, and oriented differently than the second acoustic reflector portion. In some example embodiments, the micro-acoustic resonator and the IC layers include a shared layer (e.g., the third layer 506 in FIG. 5), the shared layer including an overhang portion over the cavity, the micro-acoustic resonator and the anchor being formed in the overhang portion. In some example embodiments, the overhang portion includes: a trench (e.g., the central acoustic reflector trench 234 in FIGS. 2 and 5) that forms a first reflective boundary of the first acoustic reflector portion; a second trench that forms a second reflective boundary of the second acoustic reflector portion, the second trench (e.g., the side acoustic reflector trench 232A in FIGS. 2 and 5) oriented differently than the first trench; and a third trench (e.g., the outer central acoustic reflector trench 508 in FIG. 5) that forms a third reflective boundary portion of the third acoustic reflector portion. In some example embodiments, the dimensions of the bridge, the first acoustic reflector portion, and the second acoustic reflector portion are selected based on a target wavelength related to a resonant frequency of the micro-acoustic reso- nator.

In some example embodiments, an IC layer includes: a micro-acoustic resonator portion (e.g., the micro-acoustic resonator 202 in FIGS. 2 and 5); an ambient portion (e.g., the ambient portion 218 in FIGS. 2 and 5) separated from micro-acoustic resonator by a trench (e.g., the trench 208 in FIGS. 2 and 5); and an anchor (e.g., the anchor zone 204B in FIGS. 2 and 5) between the micro-acoustic resonator and the ambient portion. The anchor includes: a bridge portion (e.g., the bridge 206B in FIGS. 2 and 5) that extends across the trench; a first acoustic reflector portion (e.g., a first part of the anchor branch 236A in FIGS. 2 and 5) coupled to the bridge portion and oriented differently than the bridge portion; and a second acoustic reflector portion (e.g., a second part of the anchor branch 236A in FIGS. 2 and 5) coupled to the first acoustic reflector portion and oriented differently than the first acoustic reflector. In some example embodiments, the trench is a first trench, and the anchor is formed based on a second trench (e.g., the central acoustic reflector trench 234 in FIGS. 2 and 5) that forms a reflective boundary of the first acoustic reflector portion.

In some example embodiments, the reflective boundary is a first reflective boundary, and the anchor is formed based on a third trench (e.g., the side acoustic reflector trench 232A in FIGS. 2 and 5) that forms a second reflective boundary of the second acoustic reflector portion, the first reflective boundary being oriented differently than the second reflec- tive boundary. In some example embodiments, the second trench and the third trench are concave trenches relative to the micro-acoustic resonator (i.e., the second trench and the third trench are oriented to reflect acoustic energy back towards the micro-acoustic resonator). In other example embodiments, each of the first trench and the second trench may form a corner, an L shape, or other shape configured to reflect acoustic energy back toward the micro-acoustic reso- nator.

In some example embodiments, the anchor includes a third acoustic reflector portion (e.g., another part of the anchor branch 236A when the outer central acoustic reflector trench 508 in FIG. 5 is used) based on a fourth trench (e.g., the outer central acoustic reflector trench 508 in FIG. 5). The third acoustic reflector portion is coupled to the second acoustic reflector portion and is oriented differently than the second acoustic reflector portion. In some example embodi- ments, the fourth trench is a concave trench relative to the micro-acoustic resonator (i.e., the fourth trench is oriented to reflect acoustic energy back towards the micro-acoustic resonator). In other example embodiments, the fourth trench may form a corner, an L shape, or other shape configured to reflect acoustic energy back toward the micro-acoustic reso- nator. In some example embodiments, the dimensions of the bridge, the first acoustic reflector portion, and the second acoustic reflector portion are selected based on a target wavelength related to a resonant frequency of the micro- acoustic resonator.

Figure 6:
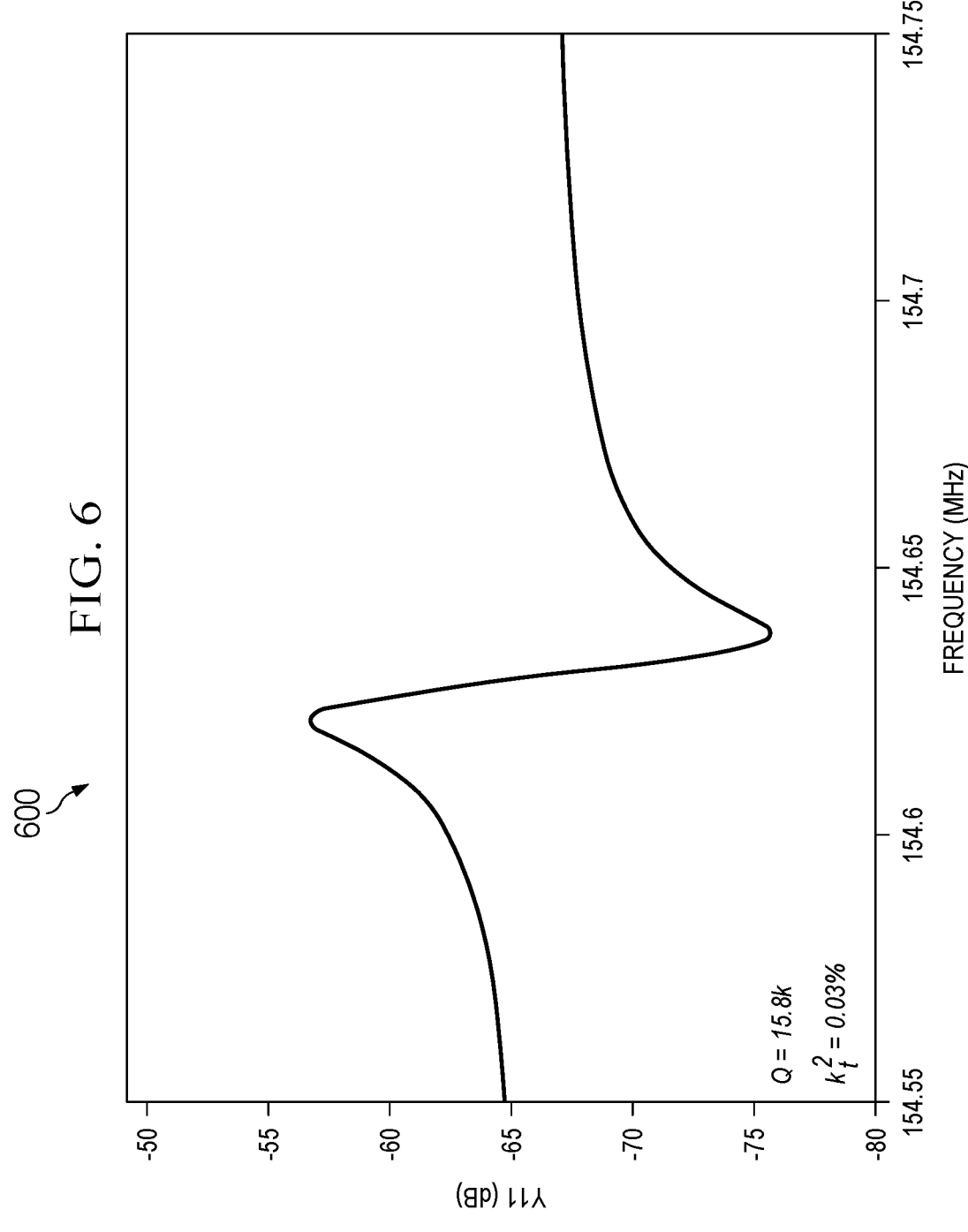
FIG. 6 is a graph illustrating the frequency response of a micro-acoustic resonator in accordance with an example embodiment.

FIG. 6 is a graph 600 illustrating the frequency response of a micro-acoustic resonator (e.g., the micro-acoustic resonator 202 of FIGS. 2, 4, and 5, or the micro-acoustic resonator 202A of FIG. 3) in accordance with an example embodiment. In graph 600, the one port admittance (Y11) response of a micro-acoustic resonator having the anchor design described herein is shown. Without limitation, the quality factor (Q) related to the Y11 is 15.8k and the electromechanical coupling ($k_t^2$) is 0.03%. When a micro- acoustic resonator includes offset acoustic reflector trenches and related acoustic reflection surfaces as described herein, Q is improved relative to other anchor options (e.g., the anchor design in FIG. 1).

Figure 7:
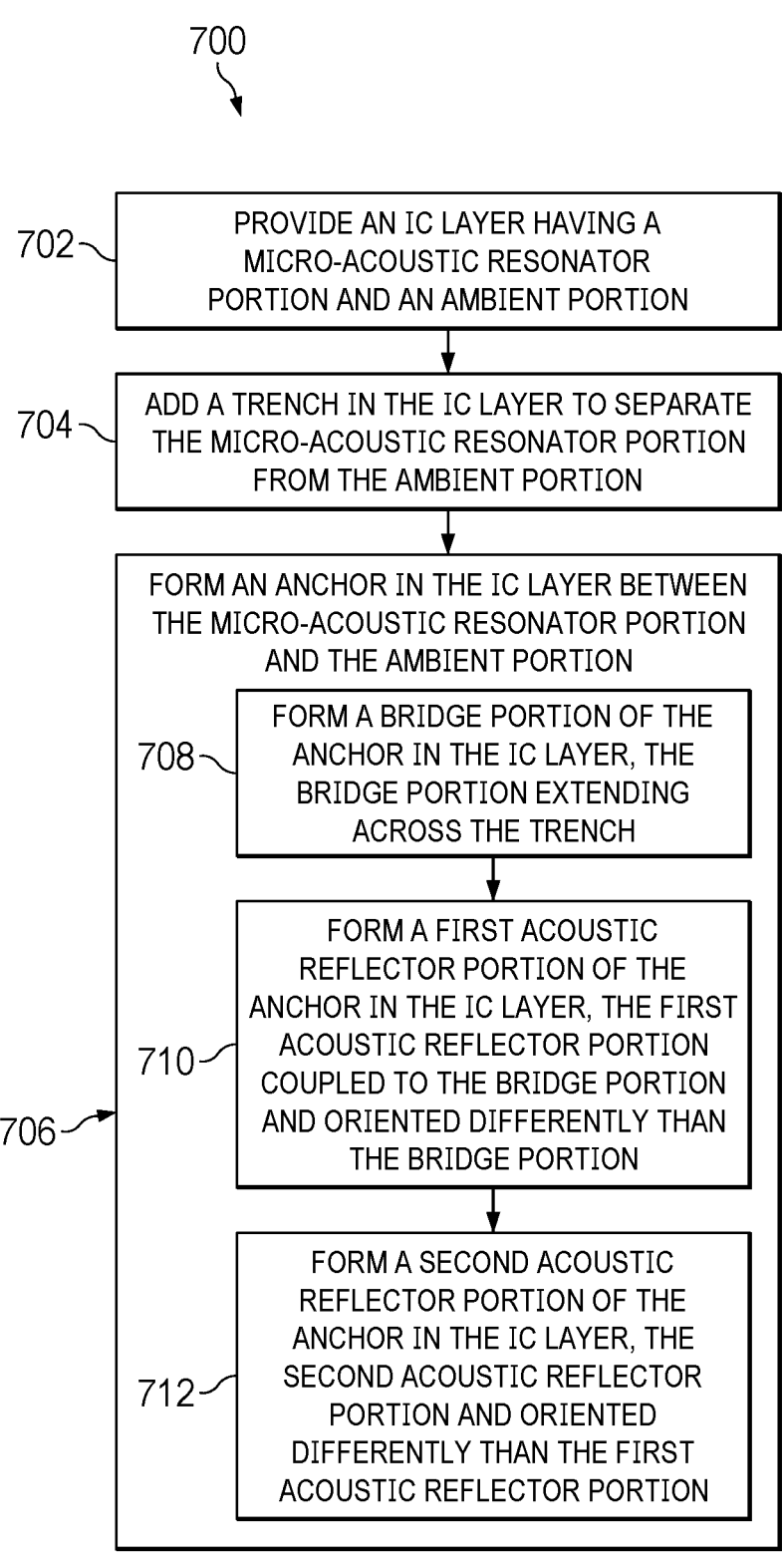
FIG. 7 is a flowchart illustrating a method of manufac-turing an IC layer having a micro-acoustic resonator and anchor design in accordance with an example embodiment.

FIG. 7 is a flowchart illustrating a method 700 of manu- facturing an IC layer having a micro-acoustic resonator and anchor design in accordance with an example embodiment. As shown, the method 700 includes providing an IC layer (e.g., the third IC layer 506 of the IC 500 of FIG. 5) having a micro-acoustic resonator portion and an ambient portion (e.g., the ambient portion 218 in FIGS. 2, 4, and 5) at block 702. At block 704, a trench (e.g., trenches 208 and 210 in FIGS.) is added in the IC layer to separate the micro- acoustic resonator portion from the ambient portion. At block 706, an anchor is formed in the IC layer between the micro-acoustic resonator portion and an ambient portion. In some example embodiments, forming the anchor at block 706 includes steps 708, 710, and 712. In different example embodiments, the order in which the steps 708, 710, and 712 are performed may vary. In the example of FIG. 7, forming the anchor at block 706 includes forming a bridge portion (e.g., the bridge 206A or 206B in FIG. 2) of the anchor in the IC layer at block 708, where the bridge extends beyond the trench formed at block 704. At block 710, a first acoustic reflector portion (e.g., part of anchor zone 204B or anchor branch formed based on the central acoustic reflector trench 234) of the anchor is formed in the IC layer, where the first acoustic reflector portion is coupled to the bridge portion and oriented different than the bridge portion. At block 712, a second acoustic reflector portion (e.g., part of the anchor zone 204B or anchor branch formed by one or more of the side acoustic reflector trenches 232A and 232B) of the anchor is formed in the IC layer. The second acoustic reflector portion is coupled to the first acoustic reflector portion and oriented differently than the first acoustic reflec- tor portion.

In some example embodiments, the trench (e.g., the trench 208 or 210 in FIG. 2) is a first trench, and forming the anchor includes adding a second trench (e.g., the central acoustic reflector trench 234 in FIG. 2) that forms a reflec- tive boundary of the first acoustic reflector portion. In some example embodiments, the reflective boundary is a first reflective boundary (e.g., the reflective boundary formed by the central acoustic reflector trench 234), and forming the anchor includes adding a third trench (e.g., one of the side acoustic reflector trenches 232A or 232B) that forms a second reflective boundary of the second acoustic reflector portion, where the first reflective boundary is oriented dif- ferently than the second reflective boundary. In some example embodiments, the second trench and the third trench are concave trenches relative to the micro-acoustic resonator.

In some example embodiments, forming the anchor includes forming a third acoustic reflector portion based on a fourth trench (e.g., an outer central acoustic resonator trench as in FIGS. 2 and 5). The third acoustic reflector portion is coupled to the second acoustic reflector portion and oriented differently than the second acoustic reflector portion. In some example embodiments, the fourth trench is a concave trench relative to the micro-acoustic resonator. In other example embodiments, the fourth trench may form a corner, an L shape, or other shape configured to reflect acoustic energy back toward the micro-acoustic resonator. In some example embodiments, forming the anchor includes selecting dimensions of the bridge, the first acoustic reflector portion, and the second acoustic reflector portion based on a target wavelength related to a resonant frequency of the micro-acoustic resonator.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter.

Modifications are possible in the described examples, and other examples are possible within the scope of the claims.

What is claimed is:

1. An apparatus, comprising:
a first layer including a cavity; and
a second layer on the first layer and including:
an opening over the cavity;
an anchor on a side of the opening, the anchor being over the cavity and including a first segment and a second segment; and
a device in the opening and over the cavity and coupled to the anchor.

2. The apparatus of claim 1, wherein the first and second layers are part of an integrated circuit, the first layer includes a semiconductor material, and the second layer includes at least one of metal, a piezoelectric material, or the semiconductor material.

3. The apparatus of claim 1, wherein the anchor includes:
a third segment coupled to and angled from the first segment;
a first trench, a second trench, and a third trench, the first segment being between an edge of the anchor and the first trench, the second segment being between the first trench and the second trench, and the third segment being between the first trench and the third trench; and
wherein each of the first, second, and third trenches forms a respective acoustic reflective boundary.

4. The apparatus of claim 3, wherein the acoustic reflective boundary formed by the first trench has a different orientation from the acoustic reflective boundaries formed by the second and third trenches.

5. The apparatus of claim 4, wherein at least one of the first trench, the second trench, or the third trench is a concave trench relative to the device.

6. The apparatus of claim 3, wherein the anchor includes a fourth trench on a periphery of the first, second, and third trenches and extending along at least parts of the first, second, and third trenches.

7. The apparatus of claim 3, wherein the anchor is a first anchor, and the second layer further:
a second anchor over the cavity and opposing the first anchor, the second anchor coupled to the device and including:
a fourth segment, a fifth segment, and a sixth segment, the fourth segment coupled to and angled from the fifth and the sixth segments; and
a fourth trench, a fifth trench, and a sixth trench, the fourth segment being between an edge of the second anchor and the fourth trench, the fifth segment being between the fourth trench and the fifth trench, and the sixth segment being between the fourth trench and the sixth trench.

8. The apparatus of claim 3, wherein the device is a resonator, and dimensions of the first through third trenches are based on a target wavelength related to a resonant frequency of the resonator.

9. An apparatus comprising:
a resonator portion over a cavity;
an anchor over the cavity, the anchor including trenches; and
a bridge over the cavity and coupled between the resonator and and edge of the anchor.

10. The apparatus of claim 9, wherein the trenches include a first trench extending from the edge and a second trench opposing the bridge.

11. The apparatus of claim 10, wherein:
the second trench has a first portion and a second portion;
the anchor includes a third trench and a fourth trench;
the first trench is on a first side of the second trench and extends from the edge and along the first portion;
the third trench is on a second side of the second trench and extends from the edge and along the second portion, and
the fourth trench is on a periphery of the first, second, and third trenches.

12. The apparatus of claim 11, wherein the second trench is a concave trench relative to the resonator.

13. The apparatus of claim 11, wherein each of the first, second, third, and fourth trenches is configurable as a respective acoustic reflector.

14. The apparatus of claim 13, wherein each of the first and third trenches is a concave trench relative to the resonator.

15. The apparatus of claim 9, wherein dimensions of the bridge and the trenches are based on a target wavelength related to a resonant frequency of the resonator.

16. A method comprising:
forming a first layer including a cavity;
forming a second layer on the first layer;
forming a resonator in the second layer and over the cavity;
forming an anchor including trenches in the second layer and over the cavity, the anchor having an edge; and
forming a bridge over the cavity and between the resonator and the edge.

17. The method of claim 16, wherein forming the trenches includes:
forming a first trench, the first trench having a first portion and a second portion;

forming a second trench on a first side of the first trench, in which the second trench extends from an edge of the anchor and along the first portion;

forming a third trench on a second side of the first trench, in which the third trench extends from the edge of the anchor and along the second portion; and forming a fourth trench on a periphery of the first, second, and third trenches, in which the fourth trench extends along at least parts of the first, second, and third trenches.

18. The method of claim 17, wherein each of the first, second, and third trenches forms a respective acoustic reflective boundary.

19. The method of claim 18, wherein at least one of the first, second, or third trenches is a concave trench.

20. The method of claim 17, wherein forming the anchor includes selecting dimensions of the bridge and the first through third trenches based on a target wavelength related to a resonant frequency of the resonator.

21. The apparatus of claim 3, wherein the second trench has a different curvature or extends along a different direction from a first portion of the first trench, and the third trench has a different curvature or extends along a different direction from a second portion of the first trench.

22. The apparatus of claim 9, wherein the cavity, the anchor, the bridge, and the trenches are part of an integrated circuit.

23. The method of claim 16, wherein the first and second layers are part of an integrated circuit.

*    *    *    *    *